(12) United States Patent
Morino

(10) Patent No.: US 9,838,561 B2
(45) Date of Patent: Dec. 5, 2017

(54) SERIAL DATA TRANSFER USING TRANSFER TYPE INFORMATION TO SELECT A STORAGE UNIT

(71) Applicants: KABUSHIKI KAISHA TOSHIBA, Tokyo (JP); TOSHIBA TEC KABUSHIKI KAISHA, Tokyo (JP)

(72) Inventor: Shigeru Morino, Numazu Shizuoka (JP)

(73) Assignees: KABUSHIKI KAISHA TOSHIBA, Tokyo (JP); TOSHIBA TEC KABUSHIKI KAISHA, Tokyo (JP)

( * ) Notice: Subject to any disclaimer, the term of this patent is extended or adjusted under 35 U.S.C. 154(b) by 185 days.

(21) Appl. No.: 14/796,672

(22) Filed: Jul. 10, 2015

(65) Prior Publication Data

US 2017/0013159 A1    Jan. 12, 2017

(51) Int. Cl.
*G06F 3/06* (2006.01)
*H04N 1/21* (2006.01)
*H03M 7/14* (2006.01)

(52) U.S. Cl.
CPC ............ *H04N 1/2158* (2013.01); *H03M 7/14* (2013.01); *H04N 2201/0094* (2013.01)

(58) Field of Classification Search
None
See application file for complete search history.

(56) References Cited

U.S. PATENT DOCUMENTS

| 5,510,854 | A  | * | 4/1996 | Meunier | ................ | H04N 5/165 327/362 |
| 6,275,890 | B1 | * | 8/2001 | Lee | ......................... | G06F 13/36 710/317 |
| 8,719,476 | B2 |   | 5/2014 | Tokuda | | |

* cited by examiner

*Primary Examiner* — Scott Sun
(74) *Attorney, Agent, or Firm* — Patterson & Sheridan LLP

(57) ABSTRACT

A serial data transfer apparatus includes a decoder, a counter, and a calculation circuit. The decoder is configured to decode serial data to obtain written data, a base address, and transfer type information for specifying a storage unit for storing the written data. The counter is configured to count a frame synchronization pulse. The calculation circuit is configured to generate a chip select signal based on the transfer type information and the base address, as decoded by the decoder, and a count value of the frame synchronization pulse output by the counter.

20 Claims, 9 Drawing Sheets

FIG. 4

| ORDER | INFORMATION |
|---|---|
| D0 | ACCESS INFORMATION |
| D1 | NUMBER OF MODULES TO BE SKIPPED |
| D2 | |
| D3 | PERMISSION OF CONTINUOUS BURST ACCESS |
| D4 | PERMISSION OF WRITING IN STORAGE UNIT |
| D5 | |
| D6 | |
| D7 | |
| D8 | BURST SIZE |
| D9 | |
| D10 | |
| D11 | |
| D12 | |
| D13 | |
| D14 | |
| D15 | |

SERIAL DATA TRANSFER USING TRANSFER TYPE INFORMATION TO SELECT A STORAGE UNIT

FIELD

Embodiments described herein relate generally to a serial data transfer apparatus, a serial data transfer method, an image formation apparatus, and a recording medium.

BACKGROUND

Serial communication is used for communication between a master device and a plurality of slave devices. For writing data in registers in the slave devices by the master device, the master device sends a pair of address data and serial data to the slave devices. For writing the data in the plurality of slave devices, it is necessary for the master device to designate an address for each of the registers in the slave devices and write the data. Therefore, as the number of registers in the slave devices increases, it takes longer to write all the data in the registers.

DESCRIPTION OF THE DRAWINGS

FIG. 4 is a diagram illustrating an example of transfer type information according to the embodiment.

DETAILED DESCRIPTION

In general, according to one embodiment, a serial data transfer apparatus includes a decoder, a counter, and a calculation circuit. The decoder is configured to decode serial data to obtain written data, a base address, and transfer type information for specifying a storage unit for storing the written data. The counter is configured to count a frame synchronization pulse. The calculation circuit is configured to generate a chip select signal based on the transfer type information and the base address, as decoded by the decoder, and a count value of the frame synchronization pulse output by the counter.

Figure 1:
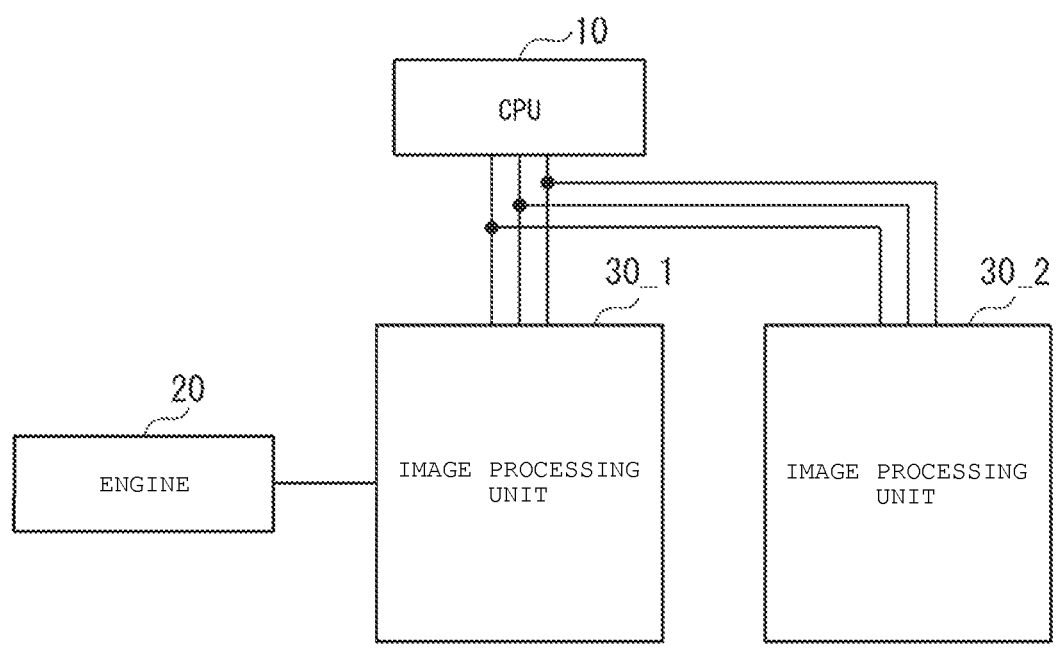
FIG. 1 is a diagram illustrating a configuration example of an image formation apparatus according to an embodiment.

Hereinafter, a description will be given of the serial data transfer apparatus according to the embodiment with reference to drawings. FIG. 1 is a diagram illustrating a configuration example of a serial data transfer apparatus 1 according to the embodiment. For example, the serial data transfer apparatus 1 is a quadruple tandem-type image formation apparatus. In the embodiment, a description will be given of a case where the serial data transfer apparatus 1 is an image formation apparatus.

An image formation apparatus 1 includes a central processing unit (CPU) 10, an engine 20, an image processing unit 30_1, and an image processing unit 30_2.

The CPU 10 performs serial communication with the image processing unit 30_1 and the image processing unit 30_2. The CPU 10 is connected to the image processing unit 30_1 and the image processing unit 30_2 via a plurality of different communication lines. The CPU 10 is a master device. Although a configuration in which the number of image processing units for the serial communication is two will be described, the number is not limited thereto.

The communication lines include a first communication line, a second communication line, and a third communication line. The first communication line transmits a frame synchronization pulse (FSS) to the image processing unit 30_1 and the image processing unit 30_2. The second communication line is a line for transmitting a serial clock (SCLK) to the image processing unit 30_1 and the image processing unit 30_2. The third communication line transmits serial data (SDL) to the image processing unit 30_1 and the image processing unit 30_2.

The engine 20 has a print function, a facsimile function, a scanner function, and a copy function. For example, the engine 20 is a print engine and a scanner engine. The engine 20 reads an original document. The engine 20 sends image data read from the original document to the image processing unit 30_1.

The image processing unit 30_1 acquires the image data from the engine 20. The image processing unit 30_1 separates colors of the acquired image data into Y, M, C, and K. The image processing unit 30_1 outputs the image data after the color separation to the engine 20. In addition, the image processing unit 30_1 performs serial communication with the CPU 10. For example, the image processing unit 30_1 is a hardware device. For example, the hardware device is an application specific integrated circuit (ASIC). The image processing unit 30_1 is a slave device. Since the image processing unit 30_2 has the same configuration as that of the image processing unit 30_1, the description thereof will be omitted.

Figure 2:
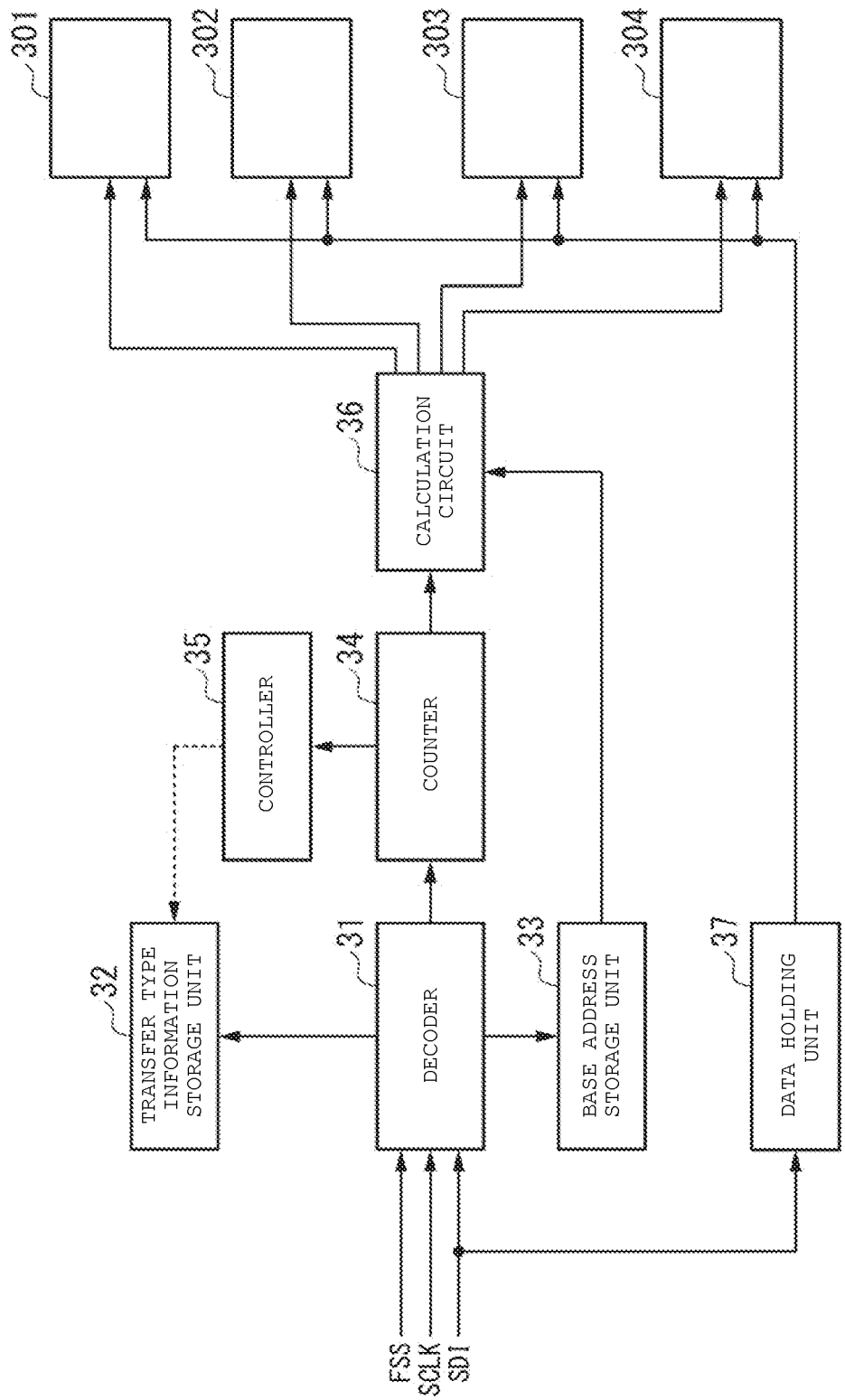
FIG. 2 is a diagram illustrating a configuration example of an image processing unit according to the embodiment.

FIG. 2 is a block diagram illustrating a configuration example of the image processing unit 30_1. The image processing unit 30_1 includes a decoder 31, a transfer type information storage unit 32, a base address storage unit 33, a counter 34, a controller 35, a calculation circuit 36, a data holding unit 37, and storage units 301 to 304.

Figure 3:
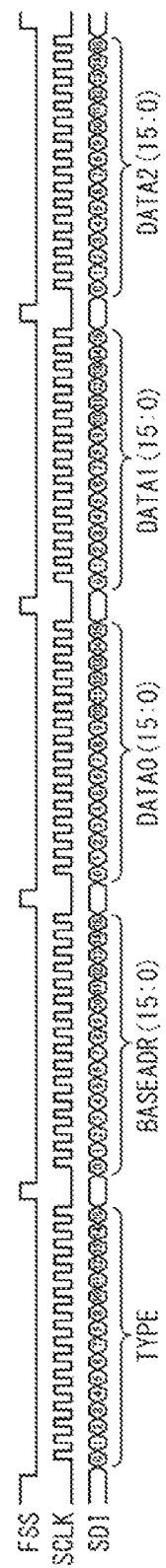
FIG. 3 is a diagram illustrating a timing of data as a target of serial communication according to the embodiment.

The decoder 31 acquires the frame synchronization pulse, the serial clock, and the serial data from the CPU 10 via the communication lines. The decoder 31 decodes the serial data. FIG. 3 is a timing chart of data as a target of serial communication between the image processing unit 30_1 and the CPU 10. According to the embodiment, a size of serial data of one frame in the serial communication between the image processing unit 30_1 and the CPU 10 is 16 bits. The first frame in the serial data during burst access includes transfer type information. For example, the transfer type information determines which of burst access or direct access is to be selected. The burst access is an access method where an address is not designated for each data item. The direct access is an access method of designating an address for each data item. Direct access is a well-known technology and the description thereof will be omitted for clarity. The next frame includes a base address. The base address is an address that is a reference for writing data in the storage units 301 to 304 during the burst access. The serial data after the base address is data to be written in the storage units 301 to 304. FIG. 4 is a diagram illustrating an example of the transfer type information. In addition, the transfer type information illustrated in FIG. 4 is an example, and the exemplary embodiments are not limited thereto.

The first bit (D0) represents access information. If D0 is logic "1", the access information represents the burst access. If D0 is logic "0", the access information represents the direct access. The second bit (D1) and the third bit (D2) represent information necessary for specifying modules to be accessed. For example, the modules are the storage units 301 to 304. A case where the second bit (D1) is logic "1" and the third bit (D2) is logic "0" represents that one of the plurality of modules (storage units 301 to 304) is to be accessed. A case where the second bit (D1) is logic "1" and the third bit (D2) is logic "1" represents that the CPU 10 is to access the modules in order with reference to the base address. A case where the second bit (D1) is logic "0" and the third bit (D2) is logic "1" represents that a module of every two modules is to be accessed with reference to the base address. A case where the second bit (D1) is logic "0" and the third bit (D2) is logic "0" represents that the CPU 10 is to access a base address of the adjacent image processing unit 30_2 with reference to the base address of the image processing unit 30_1. The fourth bit (D3) is used when the image processing unit is cascade-connected. If the fourth bit (D3) is logic "1", continuous burst access between the image processing unit 30_1 and the image processing unit 30_2 is allowed.

The fifth bit (D4) to the eighth bit (D7) represent the image processing unit as a target of the burst access among the cascade-connected image processing units.

The ninth bit (D8) to the sixteenth bit (D15) represent a burst size. For example, the burst size is a total number of times of the burst access (hereinafter, referred to as a "burst access threshold value"). In addition, the transfer type information from the second bit (D1) to the sixteenth bit (D15) is information during the burst access.

The decoder 31 reads the transfer type information from the received serial data. The decoder 31 interprets the transfer type information of the received serial data. The decoder 31 writes the read transfer type information in the transfer type information storage unit 32. If the read transfer type information is burst access information, for example, the decoder 31 stores logic "1" on the transfer type information storage unit 32. That is, the decoder 31 sets a flag bit to the transfer type information storage unit 32. A case where logic "1" is stored on the transfer type information storage unit 32 represents that the burst access to the storage units 301 to 304 are currently performed.

The decoder 31 reads the base address from the received serial data. The decoder 31 writes the base address read from the received serial data in the base address storage unit 33.

The counter 34 counts the number of frames in the data sent during the burst access. For example, the counter 34 counts the frame synchronization pulse during the burst access.

The controller 35 reads the count value of the counter 34 at a constant cycle. The controller 35 resets the transfer type information storage unit 32 based on the count value or the number of times of the burst access. If the number of times of the burst access is equal to or greater than the burst access threshold value, for example, the controller 35 resets the transfer type information storage unit 32.

The calculation circuit 36 reads the base address from the base address storage unit 33. The calculation circuit 36 reads the count value from the counter 34. The calculation circuit 36 selects a storage unit as a target of the burst access among the storage units 301 to 304 based on the transfer type information, the base address, and the count value. The calculation circuit 36 outputs a chip select signal to the selected storage unit. In addition, the transfer type information is information that determines a module to be accessed, for example.

The data holding unit 37 holds data (hereinafter, referred to as "written data") to be written in the storage units 301 to 304 from the serial data. The data holding unit 37 outputs the written data to the storage units 301 to 304.

The storage units 301 to 304 acquire the chip select signal and store the written data acquired from the data holding unit 37. For example, the storage units 301 to 304 are registers corresponding to Y, M, C, and K, respectively. The storage units 301 to 304 have the same configuration.

Next, a description will be given of a method of the burst access to the storage units 301 to 304. In addition, the order described below is an example, and the embodiments are not limited thereto. In addition, a description will be given of a case where the storage units 301 to 304 are registers corresponding to Y, M, C, and K, respectively.

In the example shown below, the base address is 0000h.

Figure 5:
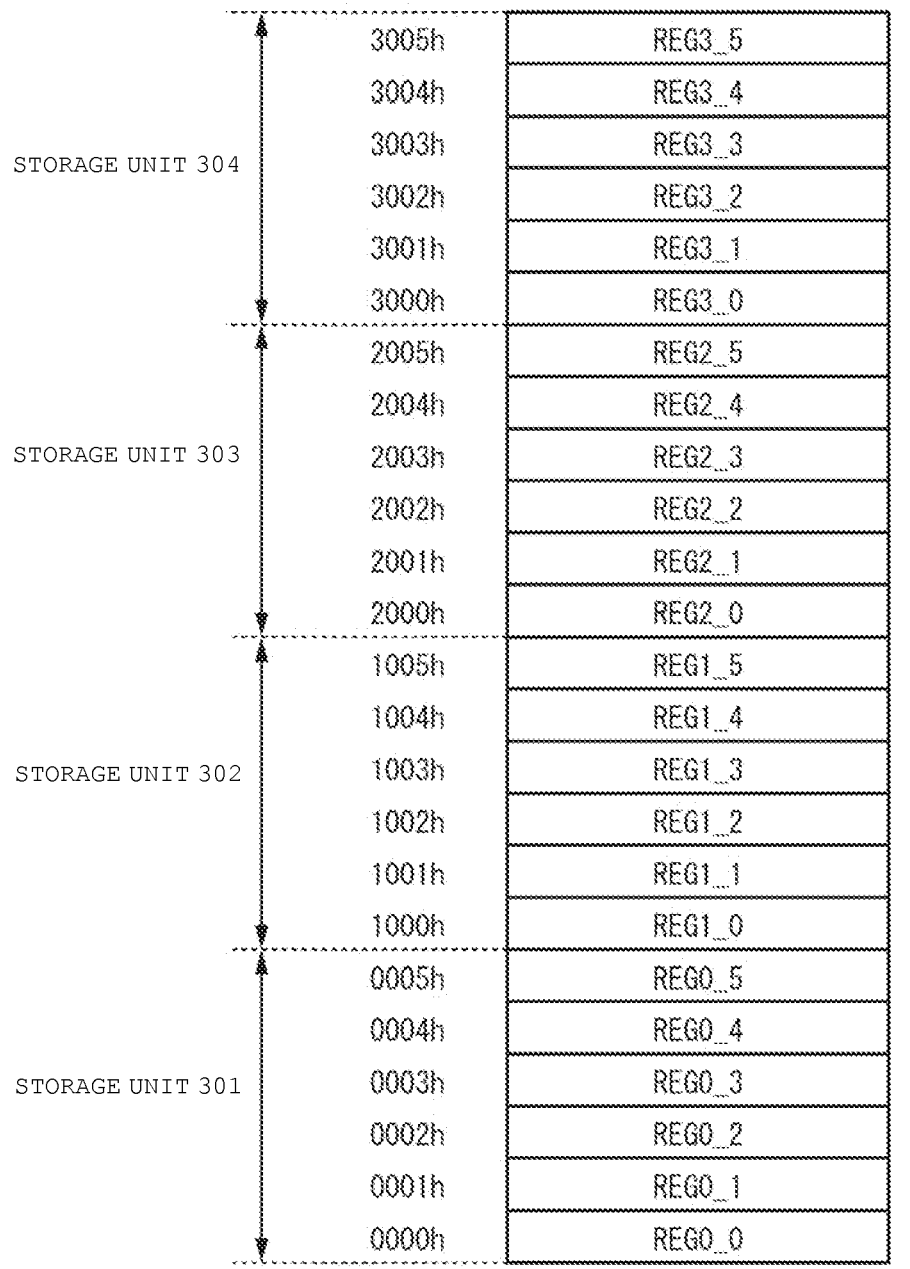
FIG. 5 is a diagram illustrating an order of burst access when a second bit of the transfer type information is 1 and a third bit thereof is 0 according to the embodiment.

FIG. 5 is a diagram illustrating a method of burst access when the second bit (D1) of the transfer type information is logic "1" and the third bit (D2) is logic "0".

For example, the storage unit 301 includes registers REG0_0 to REG0_5 corresponding to addresses 0000h to 0005h, respectively. The storage unit 302 includes registers REG1_0 to REG1_5 corresponding to addresses 1000h to 1005h, respectively. The storage unit 303 includes registers REG2_0 to REG2_5 corresponding to addresses 2000h to 2005h, respectively. The storage unit 304 includes registers REG3_0 to REG3_5 corresponding to addresses 3000h to 3005h, respectively.

As illustrated in FIG. 5, the CPU 10 accesses the register REG0_0 designated by the base address 0000h first. Then, the storage unit 301 writes written data corresponding to one frame in the register REG0_0. Then, the storage unit 301 writes written data corresponding to the next frame in the register REG0_1 following the register REG0_0. If the written data is written to the register REG0_5, the CPU 10 performs burst access to a register designated by a lower address in the next module. In addition, the next module may be set in advance. According to the embodiment, the burst access is performed in order of the storage unit 301, the storage unit 302, the storage unit 303, and the storage unit 304. Therefore, the storage unit 302 writes the written data corresponding to one frame in the register REG1_0. As described above, the burst access is sequentially performed to the continuing registers from the register designated by the base address, and the written data is written therein. That is, after the written data is written in a register, the module accesses an address obtained by incrementing an address of the register.

Figure 6:
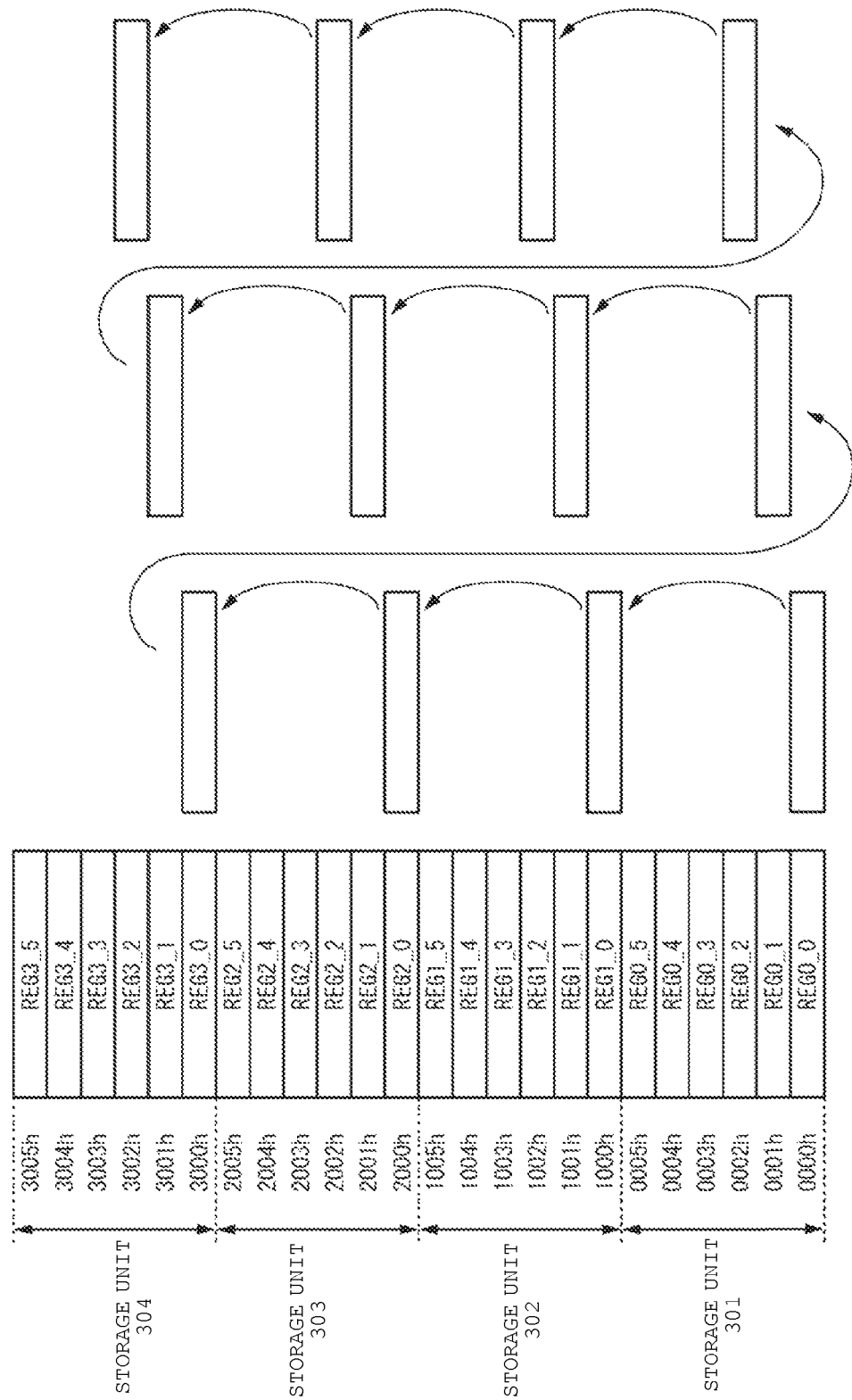
FIG. 6 is a diagram illustrating an order of the burst access when the second bit of the transfer type information is 1 and the third bit thereof is 1 according to the embodiment.

FIG. 6 is a diagram illustrating a method of the burst access when the second bit (D1) of the transfer type information is logic "1" and the third bit (D2) is logic "1". The storage unit 301 accesses the register REG0_0 designated by the base address 0000h. Then, the storage unit 301 writes the written data corresponding to one frame in the register REG0_0. After the written data is written in the register REG0_1, the written data corresponding to the next frame is written in the register in the storage unit 302. The register in the storage unit 302, in which the written data is to be written, is the register REG1_1 corresponding to the register REG0_1. That is, the written data is written in a register in a module following a module including the register in which the written data is previously written. Therefore, the CPU 10 accesses the addresses 0000h, 1000h, 2000h, and 3000h in this order, and the written data is written in the registers corresponding to the addresses. If the written data is written in the register REG3_0, the address of the storage unit 301 is accessed. At this time, the address of the storage unit 301 to be accessed is an address obtained by incrementing an address which is previously written in the storage unit 301. Therefore, the storage unit 301 accesses the address 0001h and writes the data to be written in the REG0_1. Then, the access is performed to an address obtained by incrementing an address which is previously written in the storage unit itself in order of the storage unit 302, the storage unit 303, and the storage unit 304. Then, the written data is written in the register corresponding to the address.

Figure 7:
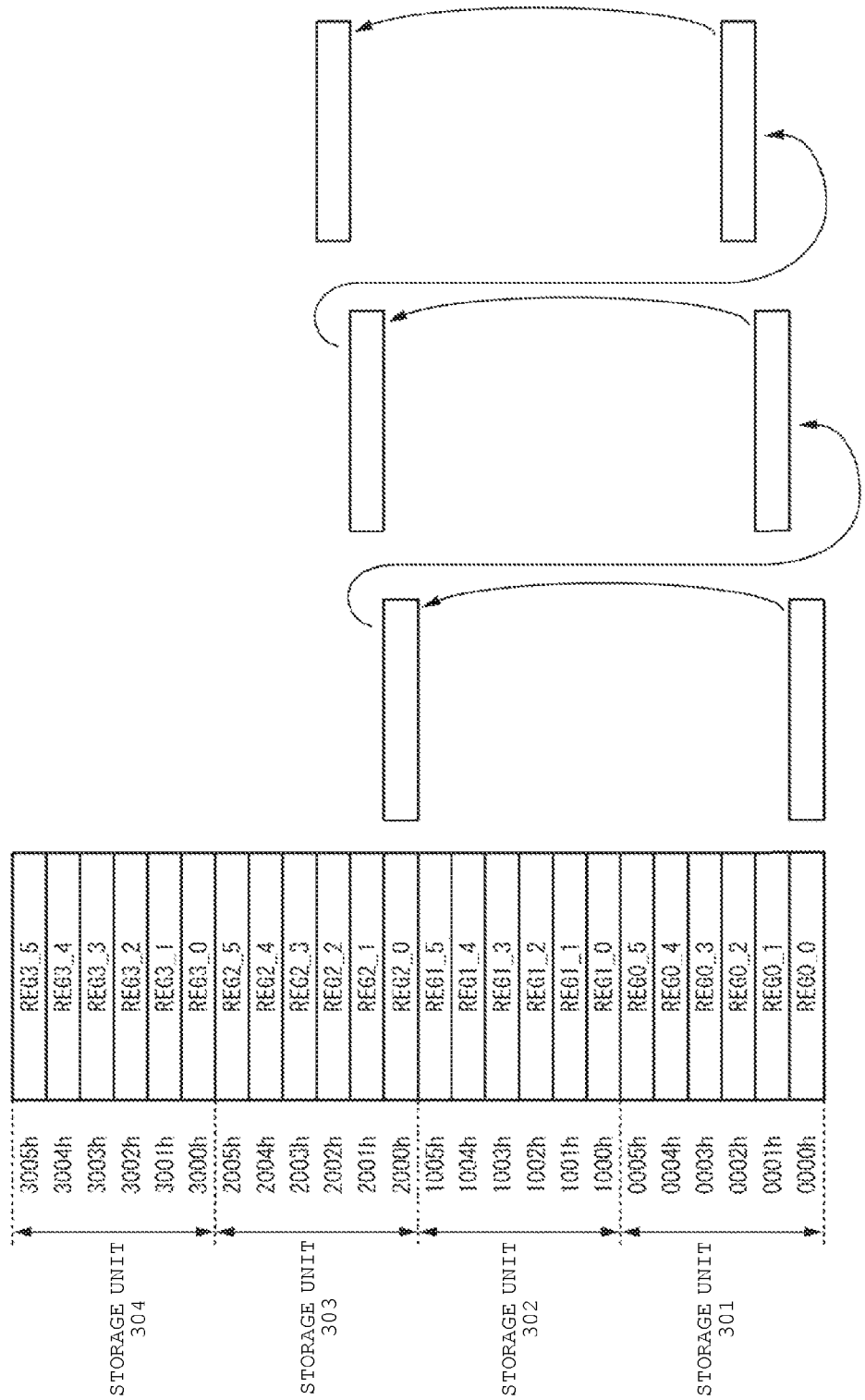
FIG. 7 is a diagram illustrating an order of the burst access when the second bit of the transfer type information is 0 and the third bit thereof is 1 according to the embodiment.

FIG. 7 is a diagram illustrating a method of the burst access when the second bit (D1) of the transfer type information is logic "0" and the third bit (D2) is logic "1".

As illustrated in FIG. 7, the storage unit 301 accesses the register REG0_0 designated by the base address 0000h. Then, the storage unit 301 writes the written data corresponding to one frame in the register REG0_0. If the written data corresponding to one frame is written, an address of the storage unit 303 as a module after skipping one module is accessed. The address to be accessed is the address 2000h corresponding to the base address 0000h. Then, the written data corresponding to the next frame is written in the register REG2_0 corresponding to the address 2000h. If the written data is written in the register REG2_0, an address of the storage unit 301 as a module after skipping one module is accessed. At this time, the address of the storage unit 301 to be accessed is an address obtained by incrementing an address that is previously written in the storage unit 301. Therefore, the storage unit 301 accesses the address 0001h and writes the data to be written in the REG0_1. As described above, the addresses are accessed in order of the address 0000h, the address 2000h, the address 0001h, the address 2001h, and so on. That is, the written data is sequentially written in the registers in the two modules (the storage unit 301 and the storage unit 303).

Figure 8:
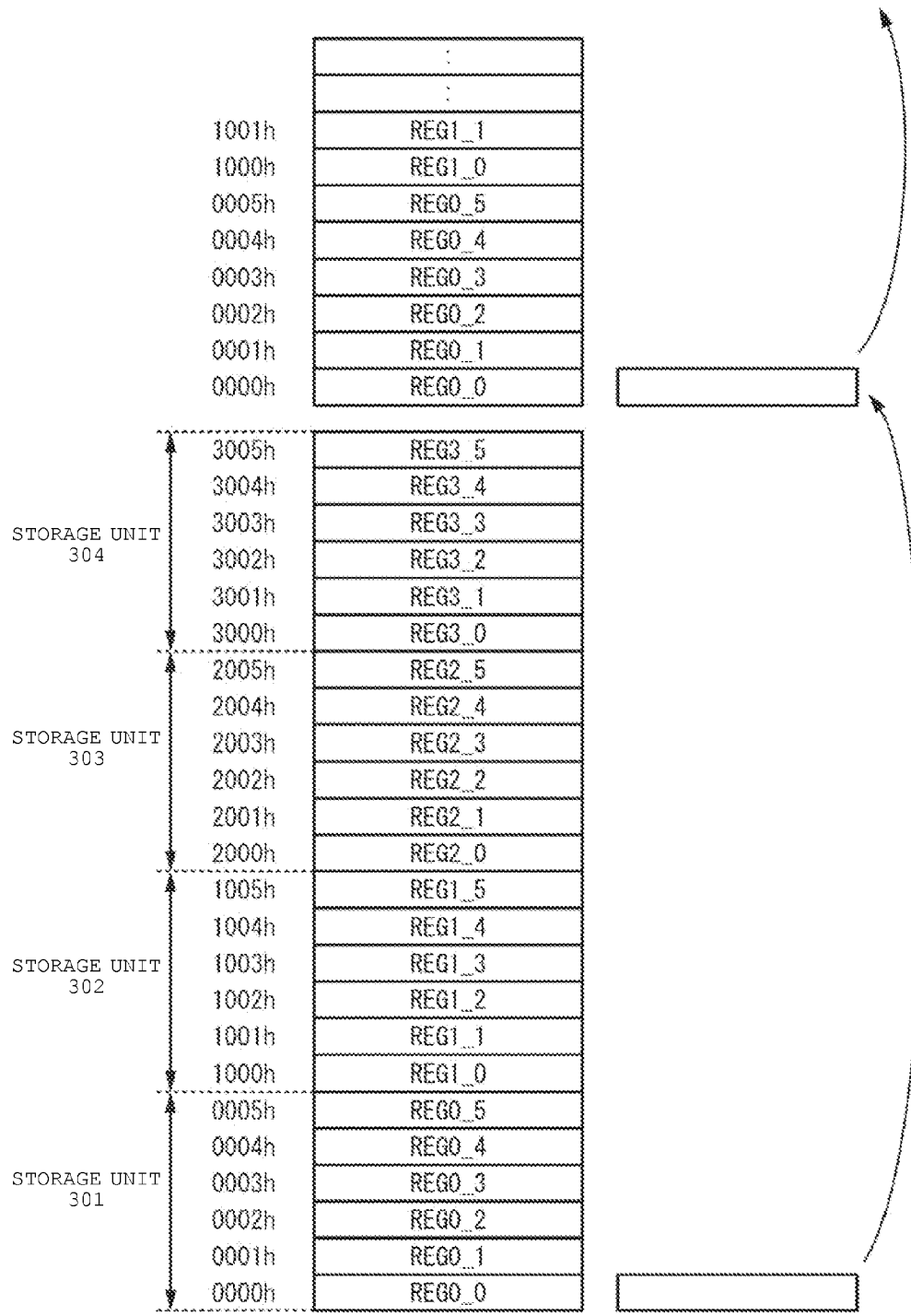
FIG. 8 is a diagram illustrating an order of the burst access when the second bit of the transfer type information is 0 and the third bit thereof is 0 according to the embodiment.

FIG. 8 is a diagram illustrating a method of the burst access when the second bit (D1) of the transfer type information is logic "0" and the third bit (D2) is logic "0". As illustrated in FIG. 8, the storage unit 301 accesses the register REG0_0 designated by the base address 0000h. Then, the storage unit 301 writes the written data corresponding to one frame in the register REG0_0. If the written data corresponding to one frame is written, the storage unit 301 in the image processing unit 30_2 is accessed. That is, a register in another slave device is accessed. Another slave device may be set in advance. The module to be accessed is the storage unit 301 in the image processing unit 30_2 corresponding to the storage unit 301 in the image processing unit 30_1. In addition, the register to be accessed has the same address as the address accessed in the storage unit 301 in the image processing unit 30_1. That is, the storage unit 301 in the image processing unit 30_2 accesses the base address 0000h. Then, the storage unit 301 in the image processing unit 30_2 writes the written data corresponding to the next frame in the register REG0_0. If the written data corresponding to one frame is written as described above, a module of the next slave device is sequentially accessed. If the base addresses 0000h of all the slave devices are sequentially accessed, a slave device as a target of the access is regarded as a initial slave device. That is, the image processing unit 30_1 accesses an address obtained by incrementing an address which is previously written in the image processing unit 30_1. Then, the written data is written in the register corresponding to the address. As described above, the written data is sequentially written in the same storage units in adjacent slave devices for each frame.

According to at least one of the embodiments described above, the serial data transfer apparatus 1 according to the embodiment includes the decoder 31, the counter 34, and the calculation circuit 36. The decoder 31 decodes the written data and the serial data including the base address and the transfer type information for specifying the storage units 301 to 304 for storing the written data. The counter 34 counts the frame synchronization pulse. The calculation circuit 36 generates the chip select signal based on the transfer type information and the base address, which are decoded by the decoder 31, and the count value of the frame synchronization pulse. Due to such a configuration, it is not necessary for the CPU 10 to designate an address for each of the storage units in the serial data transfer apparatus 1 and write the data. Therefore, it is possible to shorten the time until all the data items are written in the storage units.

Figure 9:
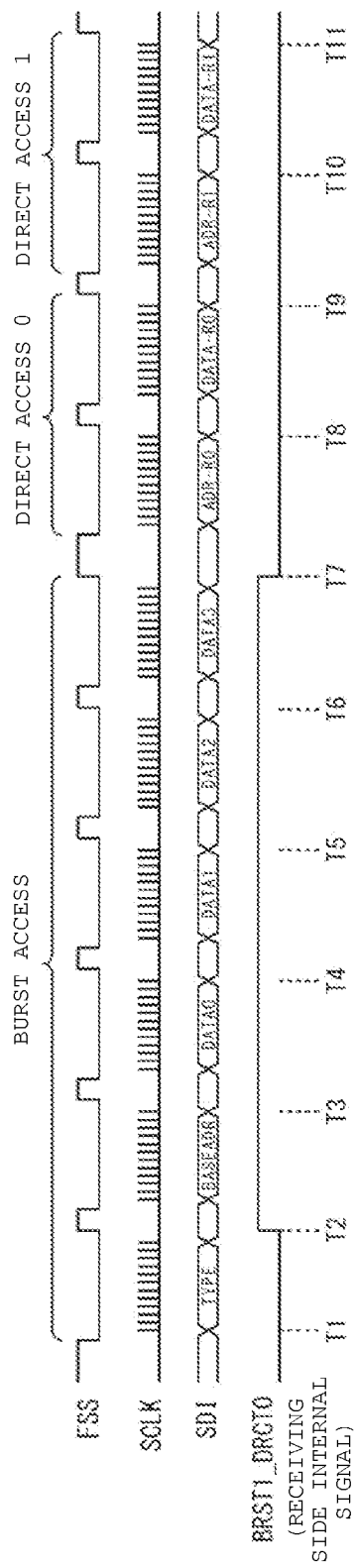
FIG. 9 is a diagram illustrating a timing of data as a target of serial communication in a case of burst access and direct access to storage units according to the embodiment.

According to the aforementioned embodiments, direct access to the storage units 301 and 302 may be performed. FIG. 9 is a timing chart of data as a target of serial communication during the burst access and the direct access to the storage units 301 and 302. In this case, the decoder 31 determines which of the burst access and the direct access to be selected based on the access information.

The image processing unit according to the aforementioned embodiments may be a software function unit or a hardware function unit, such as a large-scale integration (LSI) integrated circuit (IC).

For an entirety or a part of the functions of the aforementioned image processing unit, a program for achieving the functions is recorded in a computer readable recording medium. Then, the program recorded in the recording medium may be achieved by the CPU 10 executing the program.

In addition, the "computer readable recording medium" includes a portable medium and a storage unit. Examples of the portable medium include a flexible disk, a magnet-optical disk, a ROM, and a CD-ROM. Examples of the storage unit include a built-in hard disk in a computer system. Furthermore, the "computer readable recording medium" includes a network, a recording medium which dynamically holds the program for a short time, and a recording medium which holds the program for a predetermined time. Examples of the network include the Internet. Examples of the recording medium that dynamically holds the program include a communication line in a case of sending the program via a communication link. Examples of the recording medium which holds the program for a predetermined time include a volatile memory in a computer system which serves as a server or a client. In addition, the program may achieve a part of the aforementioned functions. Furthermore, the program may achieve the aforementioned functions in combination with a program which is recorded in advance in the computer system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A serial data from a serial data interface transfer apparatus, comprising:
   a decoder configured to decode serial data to obtain written data, a base address, and transfer type information for specifying a storage unit of a plurality of storage units for storing the written data;
   a counter configured to count a frame synchronization pulse; and
   a calculation circuit configured to generate a chip select signal based on the transfer type information and the base address, as decoded by the decoder, and a count value of the frame synchronization pulse output by the counter.

2. The apparatus according to claim 1,
   wherein the transfer type information indicates an order of the plurality of storage units in which to store the written data.

3. The apparatus according to claim 2,
   wherein the calculation circuit is configured to sequentially output the chip select signal to adjacent one of the plurality of storage units based on the transfer type information.

4. The apparatus according to claim 2,
   wherein the calculation circuit is configured to output the chip select signal to a storage unit of every two adjacent storage units of the plurality of storage units based on the transfer type information.

5. The apparatus according to claim 1,
   wherein the transfer type information further includes access information for determining whether to perform burst access or direct access.

6. The apparatus according to claim 5,
   wherein the decoder is configured to set a flag bit to a storage unit in response to the access information representing the burst access.

7. The apparatus according to claim 6,
   wherein the serial data includes a burst access threshold value representing a total number of accesses to the storage unit, and
   wherein the apparatus further comprises a controller configured to reset the flag bit in response to the number of accesses to the storage unit exceeding the burst access threshold value.

8. A serial data transfer method, comprising:
   causing a decoder to decode serial data from a serial data interface to obtain written data, a base address, and transfer type information for specifying a storage unit of a plurality of storage units for storing the written data;
   causing a counter to count a frame synchronization pulse; and
   causing a calculation circuit to generate a chip select signal based on the transfer type information and the base address, as decoded by the decoder, and a count value of the frame synchronization pulse as output by the counter.

9. The method according to claim 8,
   wherein the transfer type information indicates an order of the plurality of storage units in which to store the written data.

10. The method according to claim 9,
    further comprising causing the calculation circuit to sequentially output the chip select signal to adjacent storage units of the plurality of storage units based on the transfer type information.

11. The method according to claim 9,
    further comprising causing the calculation circuit to output the chip select signal to a storage unit of every two adjacent storage units of the plurality of storage units based on the transfer type information.

12. The method according to claim 8,
    wherein the transfer type information further includes access information for determining whether to perform burst access or direct access.

13. An image formation apparatus, comprising:
    an engine configured to read image data of an original document; and
    a serial data transfer apparatus configured to write the image data in a data holding unit,
    wherein the serial data transfer apparatus includes:
    a decoder configured to decode serial data from a serial data interface to obtain written data from the data holding unit, a base address, and transfer type information for specifying a storage unit of a plurality of storage units for storing the written data,
    a counter configured to count a frame synchronization pulse, and
    a calculation circuit configured to generate a chip select signal based on the transfer type information and the base address, as decoded by the decoder, and a count value of the frame synchronization pulse as output by the counter.

14. The image formation apparatus according to claim 13,
    wherein the transfer type information indicates an order of the plurality of storage units in which to store the written data.

15. The image formation apparatus according to claim 14,
    wherein the calculation circuit is configured to sequentially output the chip select signal to adjacent storage units of the plurality of storage units based on the transfer type information.

16. The apparatus according to claim 14,
    wherein the calculation circuit is configured to output the chip select signal to a storage unit of every two adjacent storage units of the plurality of storage units based on the transfer type information.

17. A non-transitory computer readable recording medium that stores a program for causing a computer to perform a method comprising:
    decoding serial data from a serial data interface to obtain written data, a base address, and transfer type information for specifying a storage unit of a plurality of storage units for storing the written data;
    counting a frame synchronization pulse; and
    generating a chip select signal based on the transfer type information and the base address, and a count value of the frame synchronization pulse.

18. The non-transitory computer readable recording medium according to claim 17,
    wherein the transfer type information indicates an order of the plurality of storage units in which to store the written data.

19. The non-transitory computer readable recording medium according to claim 18,
  wherein the method further comprises sequentially outputting the chip select signal to adjacent storage units of the plurality of storage units based on the transfer type information.

20. The non-transitory computer readable recording medium according to claim 18,
  wherein the method further comprises outputting the chip select signal to a storage unit of every two adjacent storage units of the plurality of storage units based on the transfer type information.

\* \* \* \* \*